United States Patent
Yang

(10) Patent No.: US 9,543,974 B1
(45) Date of Patent: Jan. 10, 2017

(54) REDUCING SWITCHING ERROR IN DATA CONVERTERS

(71) Applicant: ANALOG DEVICES, INC., Norwood, MA (US)

(72) Inventor: Wenhua W. Yang, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/858,239

(22) Filed: Sep. 18, 2015

(51) Int. Cl.
*H03M 1/06* (2006.01)
*H03M 1/10* (2006.01)
*H03M 1/66* (2006.01)

(52) U.S. Cl.
CPC ......... *H03M 1/1009* (2013.01); *H03M 1/1071* (2013.01); *H03M 1/662* (2013.01)

(58) Field of Classification Search
CPC .......... H03M 1/08; H03M 1/00; H03M 1/785; H03M 1/0678; H03M 1/747; H03M 1/685; H03M 1/1205; H03M 1/0665; H03M 1/1009; H03M 1/742; H03M 1/662; H03M 1/1071
USPC ................................................. 341/118–144
See application file for complete search history.

(56) References Cited

U.S. PATENT DOCUMENTS

| | | | | |
|---|---|---|---|---|
| 5,262,779 A | * | 11/1993 | Sauer | ................... H03K 5/2481 327/362 |
| 5,822,225 A | * | 10/1998 | Quaderer | ............... G01R 35/00 341/140 |
| 6,249,974 B1 | * | 6/2001 | Hartzell | .................. B26B 27/00 294/104 |
| 6,426,715 B1 | | 7/2002 | Westra et al. | |
| 6,567,026 B1 | * | 5/2003 | Gorman | ............... H03M 1/682 341/136 |
| 6,697,004 B1 | * | 2/2004 | Galton | .................. H03M 1/066 341/143 |
| 6,839,009 B1 | * | 1/2005 | Ali | ...................... H03M 1/1004 341/118 |
| 6,888,487 B2 | | 5/2005 | Cretti et al. | |

(Continued)

OTHER PUBLICATIONS

Kok Lim Chan et al., "Segmented Dynamic Element Matching for High-Resolution Digital-to-Analog Convertion", IEEE Transactions on Circuits and Systems—I: Regular Papers, vol. 55, No. 11, Dec. 2008, 1549-8328 © 2008, IEEE, pp. 3383-3392, 10 pages.

(Continued)

*Primary Examiner* — Lam T Mai
(74) *Attorney, Agent, or Firm* — Patent Capital Group

(57) ABSTRACT

In some converter architectures, unary digital-to-analog (DAC) converter elements generate an analog output which represents the digital input signal. Thermometer codes trigger an appropriate number of DAC elements to generate the analog output. The DAC elements are not all perfectly weighted, and mismatch shaping is often used to dynamically equalize the usage of each DAC element during data conversion to average out the mismatches. Unfortunately, mismatch shaping adds additional switching and can worsen the effect of switching errors. Switching errors which are non-linearly dependent on the input causes a second order distortion if the sum of the switching errors corresponding to a set of DAC elements is not zero. Prior to data conversion, calibration can select a subset of DAC elements having a lesser sum of switching errors for data conversion. Other (redundant) DAC elements are not used at all or shut off permanently.

31 Claims, 10 Drawing Sheets

(56) References Cited

U.S. PATENT DOCUMENTS

| | | | |
|---|---|---|---|
| 7,019,536 B1* | 3/2006 | Anderson | G01R 35/005 |
| | | | 324/601 |
| 7,173,552 B1* | 2/2007 | Garcia | H03M 1/0678 |
| | | | 341/120 |
| 7,893,856 B2 | 2/2011 | Ek et al. | |
| 8,773,294 B2* | 7/2014 | Kosic | H03M 1/1023 |
| | | | 341/118 |
| 8,842,033 B1* | 9/2014 | Abramzon | H03M 1/0626 |
| | | | 341/144 |
| 2007/0279271 A1* | 12/2007 | Ido | H03M 1/0668 |
| | | | 341/153 |
| 2008/0266153 A1* | 10/2008 | Rychen | H03M 1/1042 |
| | | | 341/120 |
| 2013/0294144 A1* | 11/2013 | Wang | G11C 29/50008 |
| | | | 365/148 |
| 2014/0266824 A1* | 9/2014 | Lowney | H03M 1/1009 |
| | | | 341/120 |
| 2015/0070199 A1* | 3/2015 | Dedic | H03M 1/10 |
| | | | 341/120 |
| 2015/0102949 A1 | 4/2015 | Rajasekhar | |

OTHER PUBLICATIONS

Long Chen, "Dynamic Element Matching With Signal-Independent Element Transition Rates for Multibit Delta Sigma Modulators", Circuits and Systems I: Regular Papers, IEEE Transactions on—Apr. 2015, DOI: 10.1109/TCSI.2015.2407434, 11 pages.

Arindam Sanyal et al., "An Enhanced ISI Shaping Technique for Multi-bit ΔΣ DACs", 978-1-4799-3432-4/14 © 2014 IEEE, pp. 2341-2344, 4 pages.

Ivar Løkken, "Digital-to-Analog Conversion in High Resolution Audio", NTNU, Norwegian University of Science and Technology, ISBN 978-82-471-1210-6 (Electronic Version), Sep. 2008, 142 pages.

Henrik T. Jensen et al., "A Low-Complexity Dynamic Element Matching DAC for Direct Digital Synthesis", IEEE Transactions on Circuits and Systems—II: Analog and Digital Signal Processing, vol. 45, No. 1, Jan. 1998, 1057-7130/98 © 1998, IEEE, pp. 13-27, 15 pages.

Benjamin Jankunas, "Design and Calibration of a 12-Bit Current-Steering DAC Using Data-Interleaving", Thesis Paper, Sep. 2014, 71 pages.

\* cited by examiner

REDUCING SWITCHING ERROR IN DATA CONVERTERS

TECHNICAL FIELD OF THE DISCLOSURE

The present invention relates to the field of integrated circuits, in particular to reducing switching error in data converters.

BACKGROUND

Real-world analog signals such as temperature, pressure, sound, or images are routinely converted, using an analog-to-digital converter (ADC), to digital information that can be easily processed in modern digital systems. In many systems, this digital information must be converted back to an analog form to perform some real-world function. The circuits that perform this step are digital-to-analog converters (DACs), and their outputs can drive a variety of devices, e.g., loudspeakers, video displays, motors, mechanical servos, radio frequency (RF) transmitters, etc. Due to various factors, circuits that make up a DAC are not perfect, and these circuits do not always perform ideally. These issues degrade the performance of DACs, e.g., resulting in a noisy or undesirable output spectrum. In many cases, a DAC is just one component of an overall system, and such degradation in performance would negatively affect the performance of the overall system.

BRIEF SUMMARY OF THE DISCLOSURE

In some converter architectures, unary digital-to-analog converter (DAC) elements generate an analog output which represents the digital input signal. Thermometer codes trigger an appropriate number of DAC elements to generate the analog output. The DAC elements are not all perfectly weighted, and mismatch shaping is often used to dynamically equalize the usage of each DAC element during data conversion to average out the mismatches. Unfortunately, mismatch shaping adds additional switching and can worsen the effect of switching errors. Switching errors which are non-linearly dependent on the input causes a second order distortion if the sum of the switching errors corresponding to a set of DAC elements is not zero. Prior to data conversion, calibration can select a subset of DAC elements having a lesser sum of switching errors for data conversion. Other (redundant) DAC elements are not used at all or shut off permanently.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Basics of Digital-to-Analog Converters

Figure 1:
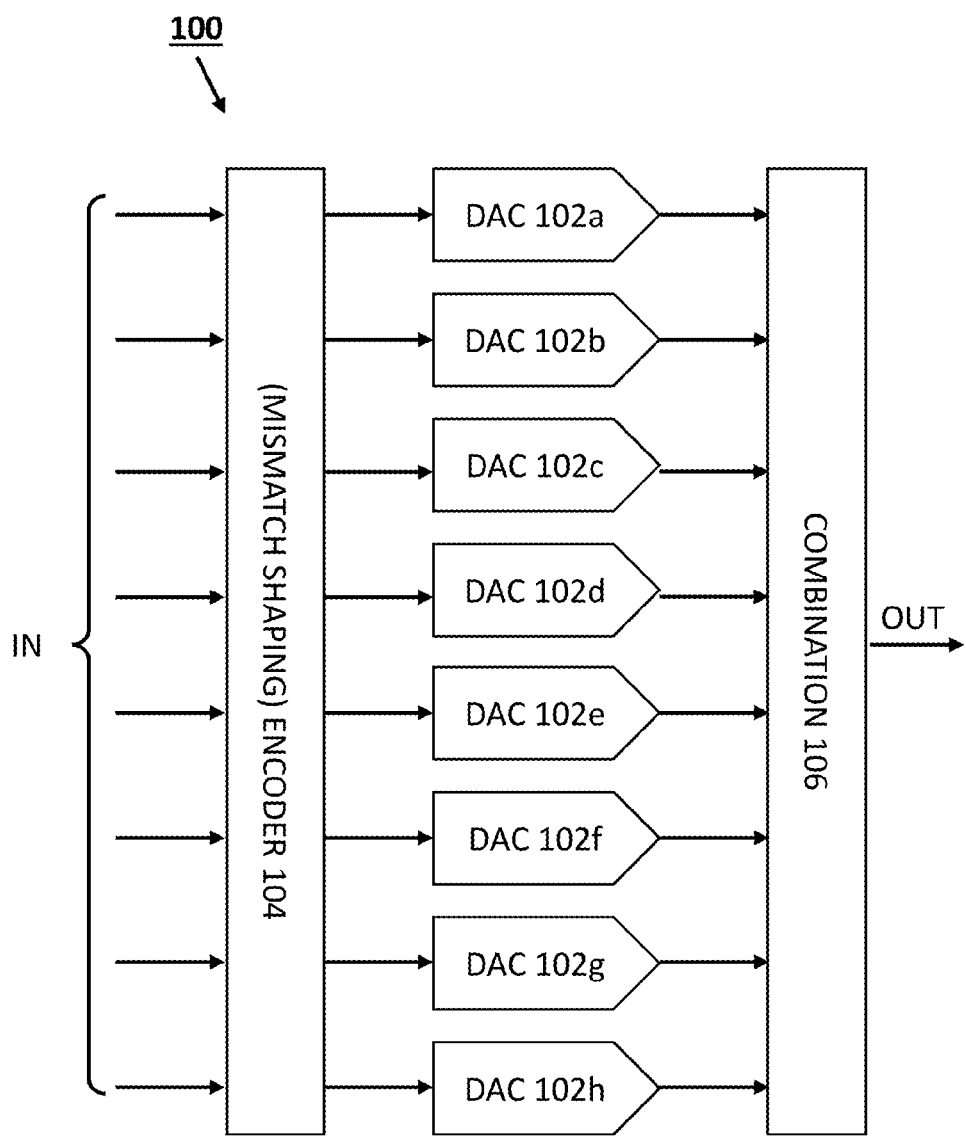
FIG. 1 is an exemplary digital-to-analog converter, according to some embodiments of the disclosure.

A digital-to-analog converter (DAC) produces a quantized (discrete step) analog output in response to a digital input code. The digital input may include, e.g. input from transistor logic (TTL), emitter-coupled logic (ECL), complementary metal-oxide-semiconductor (CMOS) circuits, or low-voltage differential signaling (LVDS), while the analog output may be either a voltage or a current. A DAC typically includes a set of individual DAC elements which are each weighted to generate a current or a voltage that makes up a fraction of the full scale of the digital input code. The individual DAC elements could comprise one or more of: current sources, voltage sources, resistors, capacitors, transistors, or any suitable circuitry, for generating a weighted output. Typically, the digital input drives switches to the individual DAC elements to selectively turn on an appropriate set of individual DAC elements, whose combined weight represents the digital input code.

Element Mismatch in Digital-to-Analog Converters

For some DACs, some of the individual DAC elements are unary weighted, i.e., intended to weight the same, and the quantized analog output would have equal steps corresponding to the possible digital input codes. However, in practice, the unary DAC elements are not perfectly weighted, and the quantized analog output would have uneven steps due to mismatches in the weights of the unary DAC elements. The uneven steps are undesirable. Such a phenomenon is called element mismatch, or sometimes referred to as unary DAC mismatch. Depending on the DAC design, unary DAC mismatch can refer to capacitor mismatch in switched capacitor (SC) DACs, current mismatch in switched current (SI) DACs, and resistor mismatch in switched resistor (SR) DACs. Dynamic element matching techniques, among others, have been applied to DACs to address element mismatch.

Randomization for Addressing Element Mismatch

To address element mismatch, randomization techniques have been applied to randomly select unary DAC elements for generating an output. For instance, an encoder can be provided to randomly select a set of X unary DAC element(s) to turn on for a thermometer-coded input X. Over time, the mismatch can be averaged out by the randomization. Such randomization technique can ensure that the mismatch error is not correlated with the input signal, and distortions which are present without randomization are replaced by random noise throughout the spectrum. The randomization technique is effective, but can raise the noise floor in the output spectrum.

Rotation for Addressing Element Mismatch

Among other techniques, mismatch shaping is a common technique for overcoming unary DAC mismatch. Rather than raising the noise floor throughout the output spectrum, mismatch shaping can shape the noise. If the signal of interest is relatively narrowband, mismatch shaping can be particularly advantageous if the noise energy can be pushed outside the band of interest. For instance, if the signal of interest is in a relatively low frequency band, and mismatch shaping can push the noise to higher frequencies. Without mismatch shaping, static mismatch tends to produce distortion tones as well as raises the noise floor. While random shuffling can spread out the tones, randomization spreads out the tones at the expense of higher noise floor. On the other hand, mismatch shaping can push static mismatch error out of band, thus can reduce both in-band distortion and noise.

One example of mismatch shaping is element rotation mismatch shaping, which selects set of X unary DAC element(s) in a circular fashion in response to an thermometer-coded input X so that the DAC elements are used roughly equally. As a result, the mismatches of the DAC elements would average out, or be minimized overtime, while pushing the energy of the noise to frequencies which are out-of-band. Element rotation mismatch shaping can also mitigate static timing delay mismatch in SI and SR DACs (SC DACs are tolerant to timing error). The following passages accompanying FIGS. 1 and 2 explains element rotation mismatch shaping in greater detail.

FIG. 1 is an exemplary digital-to-analog converter, according to some embodiments of the disclosure. In this example, DAC 100 is a 3-bit DAC, and comprises eight unary DAC elements 102*a-h*. The DAC 100 can generate nine different output levels. Other number of unary DAC elements and DAC architectures are envisioned by the disclosure, and this example serves only as an illustrative example.

A digital input IN (e.g., thermometer-coded input) is provided to a (mismatch shaping) encoder 104, which can implement element rotation mismatch shaping for equalizing usage of the unary DAC elements 102*a-h*. Specifically, the encoder 104 can switch on the appropriate connections or switches to select, e.g., in a circular fashion, a set of X unary DAC element(s) to use for converting a thermometer-coded input X to an analog output OUT. The outputs of the unary DAC elements 102*a-h* are combined by combination part 106 (e.g., summing node) to generate the final output OUT of the DAC 100.

As mentioned above, element rotation mismatch shaping can shape the mismatch error, e.g., providing a high-pass filtering effect. To push the noise into higher frequencies, the encoder 104 can ensure all elements are used equally by cycling through all the DAC elements, which makes the maximum difference in usage between the elements to be at most one. Such a scheme can ensure that all elements are used the same number of times with only a maximum difference of one (whereas it is less certain whether the elements are used equally when randomization is used). Rotation can also occur bidirectionally to rotate the DAC elements in opposite directions, if desired, where element selection ping-pongs between two independent element rotation mismatch shaping schemes rotating elements in opposite directions.

Figure 2:
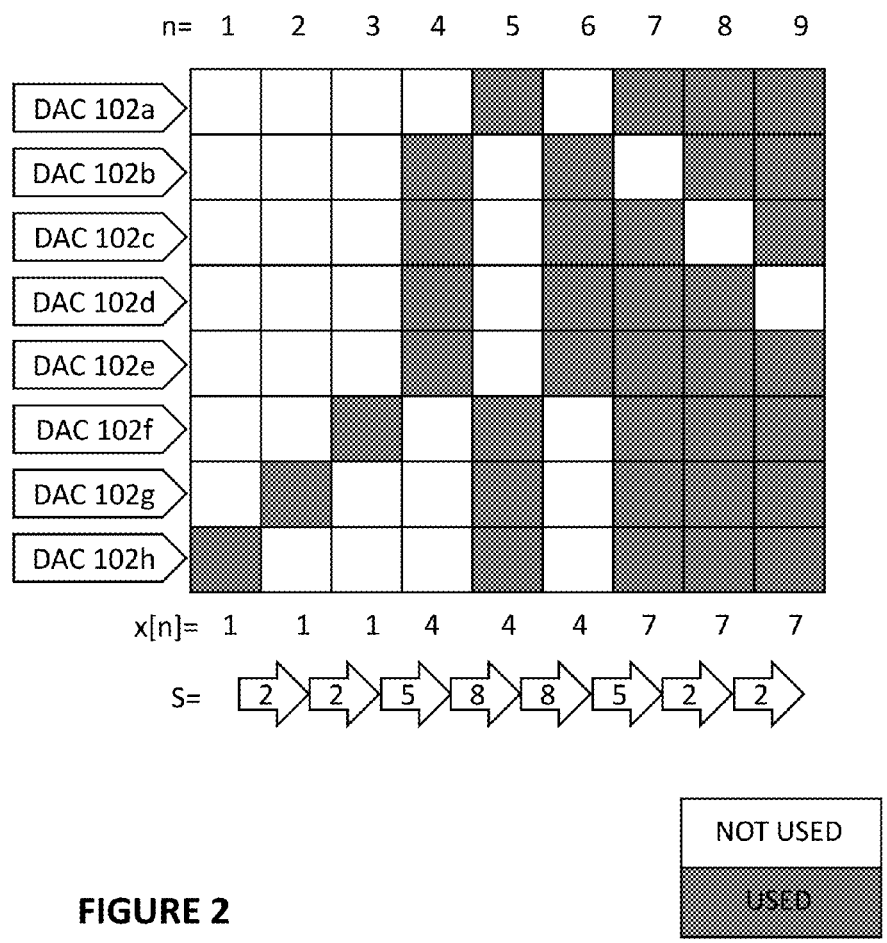
FIG. 2 illustrates an element rotation mismatch shaping technique which equalizes the usage of DAC elements, according to some embodiments of the disclosure.

FIG. 2 illustrates an element rotation mismatch shaping technique which equalizes the usage of DAC elements, according to some embodiments of the disclosure. For simplicity, the elements are rotated in one direction. As explained previously, to provide element rotation mismatch shaping, the encoder 104 can rotate usage of the DAC elements as if the DAC elements are arranged in a circular array. At time n, the encoder 104 can use the next x[n] elements in the circular array for generating the analog output OUT, and loop back when the end of array is reached. The result of this element rotation mismatch shaping scheme can shape the noise caused by mismatch like a high pass filter.

The usage pattern shown in FIG. 2 shows which DAC element(s) are used for generating the analog output OUT for a given time with an exemplary digital input x[n]. A gray-colored cell indicates a particular DAC element (from the group of unary DAC elements 102*a-h*) is used at a given time; a white-colored cell indicates a particular DAC element (from the group of unary DAC elements 102*a-h*) is not used at a given time. For this illustrative example, rotation begins at the "bottom" with DAC 102*h* and elements are rotated in the "upwards" direction.

At time n=1, 2, and 3, the exemplary input x[n] is 1. Starting at DAC 102*h*, DAC 102*h* is used for generating the output at n=1. DAC 102*g*, being the next in line from DAC 102*h* (DAC 102*h* being previously used at time n=1), is used for generating the output at n=2. DAC 102*f*, being the next in line from DAC 102*g* (DAC 102*g* being previously used at time n=2), is used for generating the output at n=3.

At time n=4, 5, and 6, the exemplary input x[n] is 4. DAC 102*b-e*, being the next in line from DAC 102*f* (DAC 102*f* being previously used at time n=3), are used for generating the output at n=4. DAC 102*a* and *f-h*, being the next in line from DAC 102*b* (DAC 102*b* being previously used at time n=4), are used for generating the output at n=5. DAC 102*b-e*, being the next in line from DAC 102*f* (DAC 102*f* being previously used at time n=5), are used for generating the output at n=6.

At time n=7, 8, and 9, the exemplary input x[n] is 7. DAC 102*a* and *c-h*, being the next in line from DAC 102*b* (DAC 102*b* being previously used at time n=6), are used for generating the output at n=7. DAC 102*a-b* and *d-h*, being the next in line from DAC 102*c* (DAC 102*c* being previously used at time n=7), are used for generating the output at n=8. DAC 102*a-c* and *e-h*, being the next in line from DAC 102*d* (DAC 102*d* being previously used at time n=8), are used for generating the output at n=9.

Switching Error Induced by Element Rotation Mismatch Shaping

While element rotation mismatch shaping can shape noise attributed to static mismatch, element rotation mismatch shaping increases switching activity in the DAC, which can worsen the effect of switching errors. The following explains switching activity in the DAC with the aid of the usage pattern shown in FIG. 2. During n=1, 2, and 3, the signal x[n] stays at 1. During the transition between n=1 and n=2 and the transition between n=2 and n=3, element rotation mismatch shaping switches on one new element and switches off the previous element. A total of S=2 elements are switched on or off. If the signal x[n] stays at 2, element rotation mismatch shaping switches on two new elements and turns off the two previous elements. A total of four elements are switched on or off. During n=4, 5, and 6, the signal x[n] stays at 4. During the transition between n=4 and n=5 and the transition between n=5 and n=6, element rotation mismatch shaping switches on four new elements and switches off the four previous elements. A total of S=8 elements are switched on or off. During n=7, 8, and 9, the signal x[n] stays at 7. During the transition between n=7 and n=8 and the transition between n=8 and n=9, element rotation mismatch shaping switches on one new element and switches off one previous element. A total of S=2 elements are switched on or off. If the signal x[n] stays at 8, no switching on or off is needed because all the elements remain switched on.

Because element rotation mismatch shaping increases number of switching elements, element rotation mismatch shaping worsens the effect of switching error. With element rotation mismatch shaping, the next sample always use the element(s) that were not used in the previous sample first. While there is no switching at 0 as no elements are used and no switching at full scale as all elements are used, at mid-scale, all the elements are switching between each sample as one sample uses half of the elements, and the next sample uses the other half of the elements. For a DAC with 2*P unary DAC elements and input x[n] having possible integer values from −P to P, the number of switching elements S is 2*(P−abs(x[n])), which has even symmetry and a strong second order dependency on input x[n]. **2*(P−abs(x[n]))**, in written form, is two times P subtracted by the absolute value of the input x[n].

It can be seen that, for element rotation mismatch shaping, the switching activity (illustrated by the variable S) has a strong second order function of the input signal. At 0 (e.g., x[n]=0) and full scale (e.g., x[n]=8), there is no switching; at midscale (e.g., x[n]=4), there is switching on or off for all DAC elements. Unfortunately, each DAC element being switched on or off can induce an error, referred often as switching error or switching induced error; each DAC element being switched on or off can have a different switching error associated with it.

The switching induced error corresponding to each DAC element can be broken down into two parts. One is linearly dependent on the input sequence, or e1*(x[n]−x[n−1]), which injects an error that is proportional to switching direction. This is equivalent to static timing error and can be high pass shaped by element rotation. The another part of the switching error is non-linearly dependent on the input, or e2*abs(x[n]−x[n−1]), which injects the same error regardless which direction the element is switching. abs( ) represents an absolute value function; abs(x[n]−x[n−1]) is the absolute value of the difference between x[n] and x[n−1]. This non-linearly dependent part is illustrated by the variable S of FIG. 2.

While the linearly dependent part is shaped by mismatch shaping, on average, the injected error attributed to the non-linearly dependent part is ave(e2)*2*(N−abs(x)), which causes a second order distortion if ave(e2), i.e., the average of e2 over the DAC elements, is not zero. Since avg(e2) is the sum of all e2 associated with the DAC elements divided by the number of the DAC elements (i.e., a constant), it is also true that the injected error attributed to the non-linearly dependent part would cause a second order distortion if the sum of all e2 associated with the DAC elements is not zero. Dynamic element matching schemes can have the same issue of the second order distortion, where at end scale there is no need for switching but at mid-scale there is maximum switching.

More broadly, this second order distortion can be present when a switching scheme is implemented to substantially equalize the usage of the DAC elements and/or to substantially limit skewed usage of the DAC elements (even when the switching is limited). Note that this second order distortion can also occur without the presence of mismatch shaping, if the input frequency is sufficiently high (e.g. close to Nyquist frequency of $f_s/2$ where $f_s$ is the sampling frequency of the converter), which could leading to a substantial amount of switching activity with the DAC elements. Mismatch shaping and/or dynamic element matching exacerbates the second order distortion.

Supplying Redundant DAC Elements and Calibrating the DAC to Minimize Switching Error To reduce the second order distortion, the DAC can be supplied with additional or redundant unary DAC elements so that the DAC can be optimized or calibrated to have the least or lesser amount of injected error distortion attributed to the non-linearly dependent part of the switching induced error. For a Y-bit DAC, $N=2^Y$ number of unary DAC elements may be required. R number of unary DAC element(s) can be provided in addition to the $N=2^Y$ number of unary DAC elements, and the R number of unary DAC element(s) are thus redundant.

Equipped with the redundant unary DAC elements, it is possible to select a subset having $N=2^Y$ number of unary DAC elements from a $M=2^Y+R$ that yields the minimum or lesser ave(e2), or average of e2 over the elements in the subset, or sum of e2 for the subset of unary DAC elements divided by $N=2^Y$. Selecting a subset of unary DAC elements that yields the minimum or lesser sum of e2 is equivalent to selecting a subset with the minimum or lesser ave(e2). Because the error e2 for different unary DAC elements can be positive or negative, the minimum or lesser ave(e2) can be the minimum or lesser absolute value of ave(e2).

Figure 3:
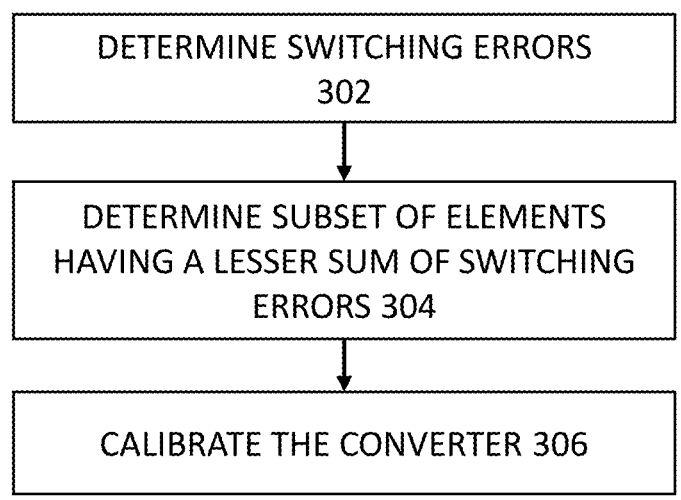
FIG. 3 shows a flow diagram illustrating a method for reducing switching error, according to some embodiments of the disclosure.

FIG. 3 shows a flow diagram illustrating a method for reducing switching error, according to some embodiments of the disclosure. In task 302, an error measuring circuit can determine switching errors corresponding to unary digital-to-analog converter (DAC) elements in a converter, wherein the switching errors are non-linearly dependent on the input to the unary DAC elements. Generally speaking, the switching errors of interest are independent from switching direction, referred herein to e2.

For instance, a system of equations can be defined in an error model and a pilot signal (e.g., or some other suitable known input) can be used as the input to the DAC to generate an analog output. Based on the pilot signal and the analog output, it is possible for the error measuring circuit to solve for switching errors corresponding to the unary DAC elements. In some embodiments, the pilot signal is a sine wave. If there is no switching induced error, a perfect output is expected. If there is switching induced error, the error model can model a particular switching induced error as a delta that is injected every time a particular unary DAC element is switched on or off. The error model can solve for the switching errors corresponding to the unary DAC elements by solving for the deltas injected due to the switching activity from observed deviations in the output from the ideal output.

For unary DAC elements which are implemented within an analog-to-digital converter (ADC) for reconstructing an analog signal and the analog output of the DAC is difficult to access, applying a sinewave to the analog input of the ADC is a reasonable choice. For unary DAC elements whose output can be observed easily, a different error measuring scheme can be used. For instance, the error measuring circuit can measure average (current) outputs of the unary digital-to-analog (DAC) elements in a converter while toggling one unary DAC element at a time to determine switching errors corresponding to unary DAC elements. Specifically, different average outputs are measured for different toggling frequencies. Measurements can be made while toggling each bit while holding other bits steady. Measurements are made for different toggling frequencies, and measurements for different toggling frequencies are repeated for different unary DAC elements. Toggling one unary DAC element at a time means toggles an output of one unary DAC element at a time (i.e., toggling the unary DAC element of interest at different toggling frequencies) while keeping outputs of the rest of the unary DAC elements fixed.

At different toggling frequencies, measurements of the average output of the unary DAC elements are made. The act of toggling one of the unary DAC element switches the unary DAC element on and off, can induce a switching error which can be observed at the output of the unary DAC elements. The observed switching error at the output is expected to be different for different toggling frequencies, if the switching error is non-zero. Holding the rest of the unary DAC elements fixed (or non-toggling) isolates the switching error corresponding one unary DAC element that is toggling from switching errors corresponding to the rest of the unary DAC elements.

If the switching error for that unary DAC element is zero, the output of the unary DAC elements all together should equal to an expected output value (no matter the toggling frequency). Suppose 7 unary DAC elements are fixed to some known state (they can be fixed to generate an output of either +1 or −1, as long as the outputs are fixed, non-toggling, and known), and the output of 1 unary DAC element of interest is toggling at a first toggling frequency. The output of the unary DAC elements is averaged over an amount of time. The first average (current) output of the unary DAC elements would equal to the expected output value plus a first switching error component. Suppose the 7 unary DAC elements are fixed (during the error measurement) to some known state (e.g., fixing four DAC elements to +1 and three DAC elements to −1, three DAC elements to +1 and DAC elements to four −1), and the output of the 1 unary DAC element of interest is now toggling at a second toggling frequency. The output is averaged over a same amount of time. The second average (current) output of the unary DAC elements would equal to the expected output value plus a second switching error component. Generally speaking, the higher the toggling frequency, the greater the switching error component since more switching means more switching induced error (if the switching error is non-zero). By measuring at least two different average outputs of the unary DAC elements corresponding to different toggling frequencies, the switching error for the 1 unary DAC element of interest can be characterized. Suppose the measurements are plotted with the average output on the Y axis and the toggling frequency on the X axis. A line can be fitted to the measurements, and the slope can be a measurement of switching error for the 1 unary DAC element of interest. The slope can be positive, which indicates a positive switching error e2 for the unary DAC element of interest. The slope can be negative, which indicates a negative switching error e2 for the unary DAC element. When the slope is zero, there is no switching error e2 for the unary DAC element. The toggling scheme can be used in the background (by toggling an element not being used for data conversion) or in the foreground (when the converter is not performing normal data conversion, or is offline).

In task 304, an optimizer can determine a subset of unary DAC elements having a lesser sum of switching errors than one or more other possible subsets of unary DAC elements. Ideally, the sum of switching errors (or the ave(e2)) is as close to 0 as possible for optimum results, so that the second order distortion e2*abs(x[n]−x[n−1]) that is non-linearly dependent on the input x[n] can be reduced or minimized. The lesser sum can mean the lesser absolute value of the sum of switching errors (to select a sum which is closest to 0), since the sum of switching errors can be positive or negative.

Note that the optimizer selects the minimum sum rather than selecting individual unary DAC elements that have the smallest error. For example, in a first case, two elements with error of +1 and −1 respectively can add up to 0, and in a second case, two elements with smaller individual error of 0.1 and 0.1 respectively can add up to 0.2. The first case has larger individual errors, but smaller sum of the switching errors. The first case would be preferred over the second case since it would result in less second order distortions.

In some embodiments, the optimizer determines sums of switching error corresponding to a plurality of possible subsets of unary DAC elements. Furthermore, the optimizer can select the subset of unary DAC elements having the least sum of switching error. For instance, suppose an Y-bit DAC has $N=2^Y$ unary DAC elements and R redundant unary DAC elements, the optimizer can evaluate the sum of e2 or ave(e2) for several subsets having $N=2^Y$ unary DAC elements selected from a total of $M=2^Y+R$ unary DAC elements, and determine the subset with the minimum or lesser sum of e2 or ave(e2) when compared against the other subsets.

Generally speaking, the switching errors of interest can cause a second order distortion at the output if a sum of the switching errors or the average of switching errors is not zero. Accordingly, selecting a subset of having $N=2^Y$ unary DAC elements that has the lesser or minimum sum of switching errors or ave(e2), or sum of switching errors or ave(e2) closest to 0 would yield the least amount of the second order distortion attributed to the switching error e2.

In task 306, control logic can calibrate the converter by selecting the subset of unary DAC elements for data conversion. Suppose an Y-bit DAC has $2^Y$ unary DAC elements and R redundant unary DAC elements (total of $M=2^Y+R$ unary DAC elements), the control logic can calibrate or optimize the converter by selecting a subset having $N=2^Y$ unary DAC elements from different/unique possible subsets having $N=2^Y$ number of unary DAC elements selected from a total of $M=2^Y+R$ unary DAC elements. The selected subset having $N=2^Y$ unary DAC elements is made usable for normal data conversion. For instance, the control logic can permanently turn off one or more unary DAC elements which are not in the subset of unary DAC elements, or permanently disconnect the one or more unary DAC elements which are not in the subset of unary DAC elements from the rest of the DAC. This task calibrates or optimizes the converter by deliberately selecting R redundant unary DAC elements to not be used at all for normal data conversion to reduce switching induced error.

Suppose a DAC has 16 unary DAC elements and 1 redundant DAC element (N=16, M=17), it is possible to choose a subset from 17 different/unique possible subsets having 16 unary DAC elements for data conversion. Suppose a DAC has 16 unary DAC elements and 2 redundant DAC elements, it is possible to choose a subset of 16 elements from a total of 18 elements. This means there are 18 choose 16=153 number of different/unique possible subsets having 16 unary DAC elements for data conversion. The number of different/unique possible subsets to choose from grows quickly with the number of redundant DAC elements available, and increases the chance of being able to select a subset of DAC elements that has ave(e2) or sum of e2 to be close to 0.

In some cases, in a DAC with 16 unary DAC elements with 2 redundant unary DAC elements (N=16, M=18), it is possible to reduce the ave(e2) by a factor of 2. In some cases, in a DAC with 16 unary DAC elements with 4 redundant unary DAC elements can reduce the ave(e2) by factor of 4. While the 4 redundant unary DAC elements incurs a 25% increase in area, there is no increase in power because the unused elements can be turned off permanently. In contrast, to get the same 4× improvement by brute force, normally power and area has to increase by 16×. Not to mention, some other possible calibration schemes can easily double the DAC area and require lots of control bits to track the drift over supply, temperature, and time. Furthermore, while it is possible to calibrate the switching error by changing the switches' thresholds, such a scheme would require putting each switch in an isolated well, which undesirably increases area and parasitic capacitance.

Selecting the Subset for Data Conversion is not the Same as Dynamic Element Matching It is noted that this calibration of the DAC by selecting a subset having $N=2^Y$ unary DAC elements is not the same as dynamic element matching, which dynamically adjusts or changes which ones of the unary DAC elements are selected to be used to convert each sample. For instance, dynamic element matching, e.g., including randomization and rotation schemes mentioned herein, selects X unary DAC elements (e.g., from N unary DAC elements available for data conversion) for converting a thermometer-coded sample X. In contrast, the method described in relation to FIG. 3 performs a calibration step to optimize and select the $N=2^Y$ unary DAC elements from $M=2^Y+R$ number of unary DAC elements for data conversion, and does not dynamically select X unary DAC elements for a thermometer-coded sample X. Furthermore, it is noted that this calibration of the DAC by selecting a subset having $N=2^Y$ unary DAC elements is not the same as dynamic element matching because dynamic element matching does not offer redundant element(s) which are turned off completely for the overall duration of data conversion of many samples. Dynamic element matching reduces the effect of static error, but at the same time, can exacerbate switching induced error due to the high level amount of switching involved. To address the problem caused by dynamic element matching, this calibration of the DAC is to be used in conjunction with dynamic element matching schemes to mitigate the effect of switching induced error.

Exemplary Converters Having Calibration for Reducing Switching Induced Error

Figure 4A:
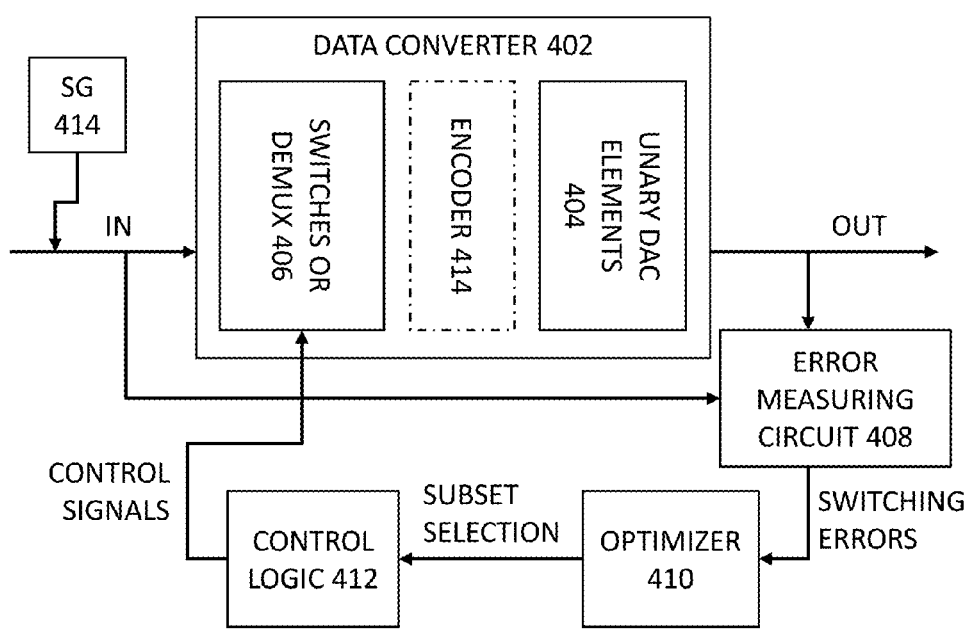
FIGS. 4A-B show exemplary data converters having a calibration circuitry for reducing switching error, according to some embodiments of the disclosure.

FIG. 4A shows an exemplary data converter having calibration circuitry for reducing switching error, according to some embodiments of the disclosure. The calibration circuitry can perform the method described in relation to FIG. 3. The data converter 402 with switching error reduction comprises unary DAC elements 404, which includes one or more redundant unary DAC elements. The data converter 402 further includes switches (or demultiplexer) 406 which allows a subset of the unary DAC elements 404 to be selected for data conversion. The switches 406 can be considered part of the calibration circuitry. The calibration circuitry can include an error measuring circuit 408 for determining switching errors corresponding to the unary DAC elements 404, wherein the switching errors are non-linearly dependent on the input to the data converter. The error measuring circuit 408 can output the switching errors corresponding to the unary DAC elements 404 to an optimizer 410 determining a subset of unary DAC elements having a lesser sum of switching errors than one or more other possible subsets of unary DAC elements. The optimizer 410 can signal to control logic 412 for calibrating the data converter by selecting the subset of unary DAC elements for data conversion. For instance, control logic 412 can output control signals to switches 406 to select the subset for data conversion.

The switches 406 provide the ability optimize the data converter 402 by selectively turn off a selection of redundant unary DAC elements (i.e., unary DAC elements which are not in the selected subset of unary DAC elements for data conversion) permanently, and not use them for data conversion at all. Selecting a subset of unary DAC elements and turning off the selected redundant unary DAC elements can be done in different ways, depending on the data converter architecture.

Figure 5:
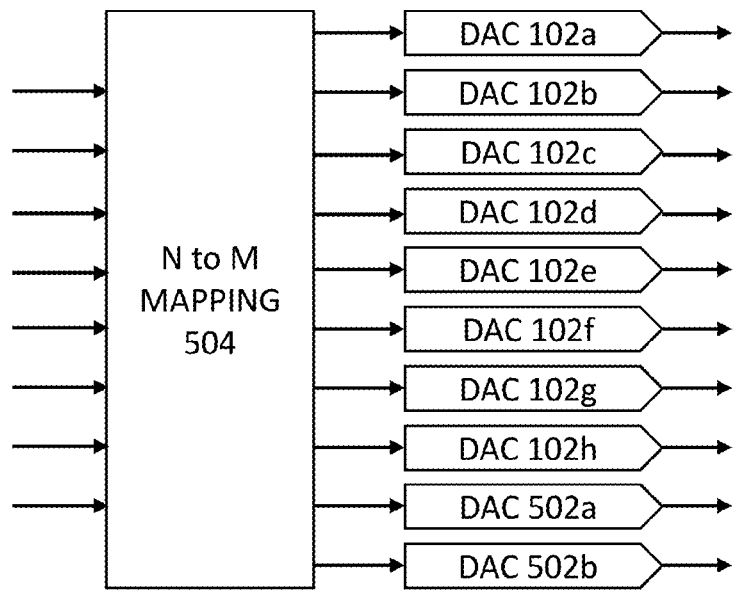
FIG. 5 shows an exemplary switching scheme for selecting a subset of unary DAC elements, according to some embodiments of the disclosure.
Figure 6:
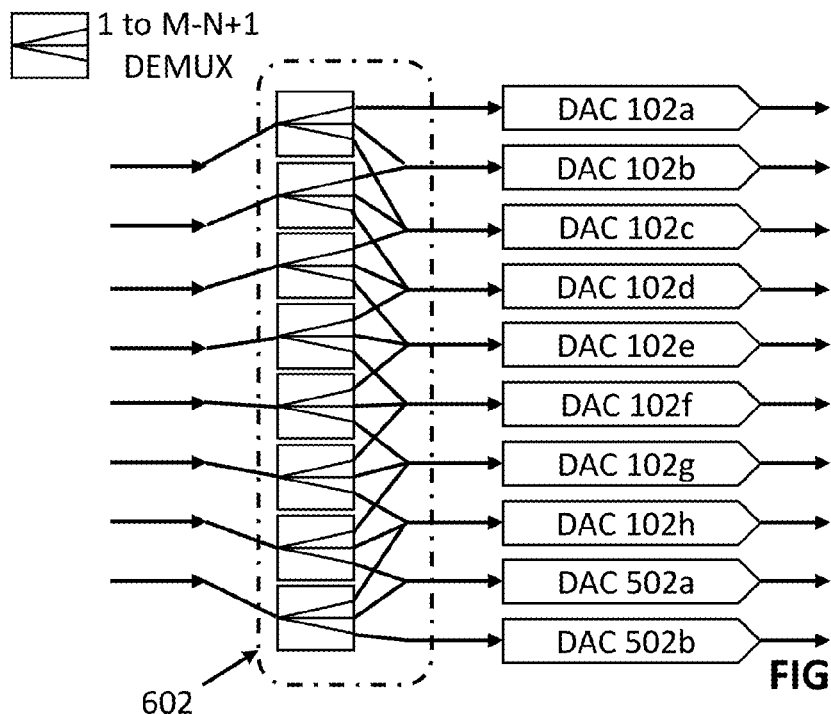
FIG. 6 shows another exemplary switching scheme for selecting a subset of unary DAC elements, according to some embodiments of the disclosure.
Figure 7:
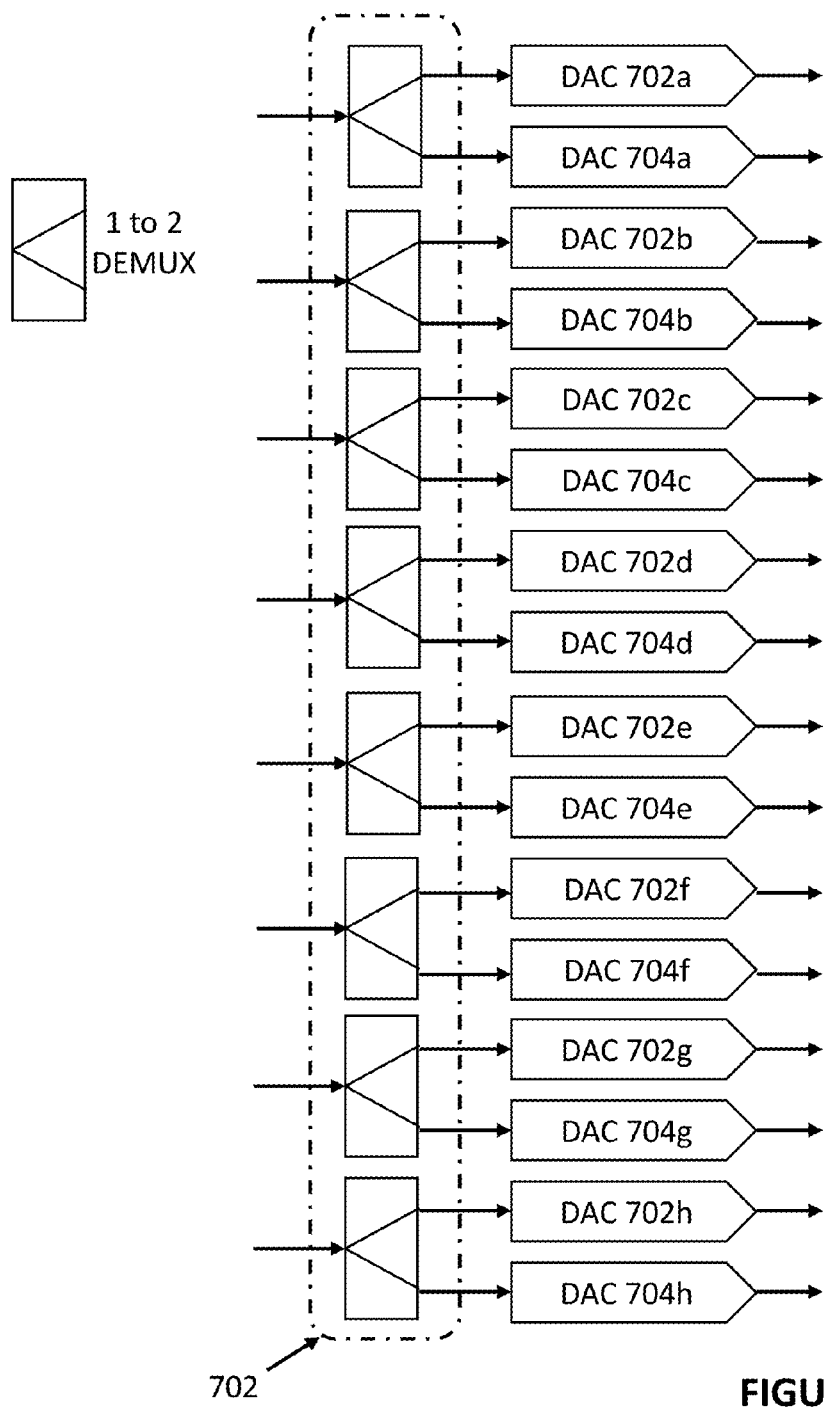
FIG. 7 shows yet another exemplary switching scheme for selecting a subset of unary DAC elements, according to some embodiments of the disclosure.

In some embodiments, the control logic 412 can output control signals to a plurality of switches 406 and control states of the switches to route input signals to only the subset of unary DAC elements for data conversion. As a result, the redundant unary DAC elements not in the subset are never used for converting the input. In some embodiments, the control logic 412 disconnects or turns off the redundant unary DAC elements not in the subset so that no power is consumed and they are never used for converting the input. Some exemplary switching schemes are illustrated in FIGS. 5-7.

Figure 4B:
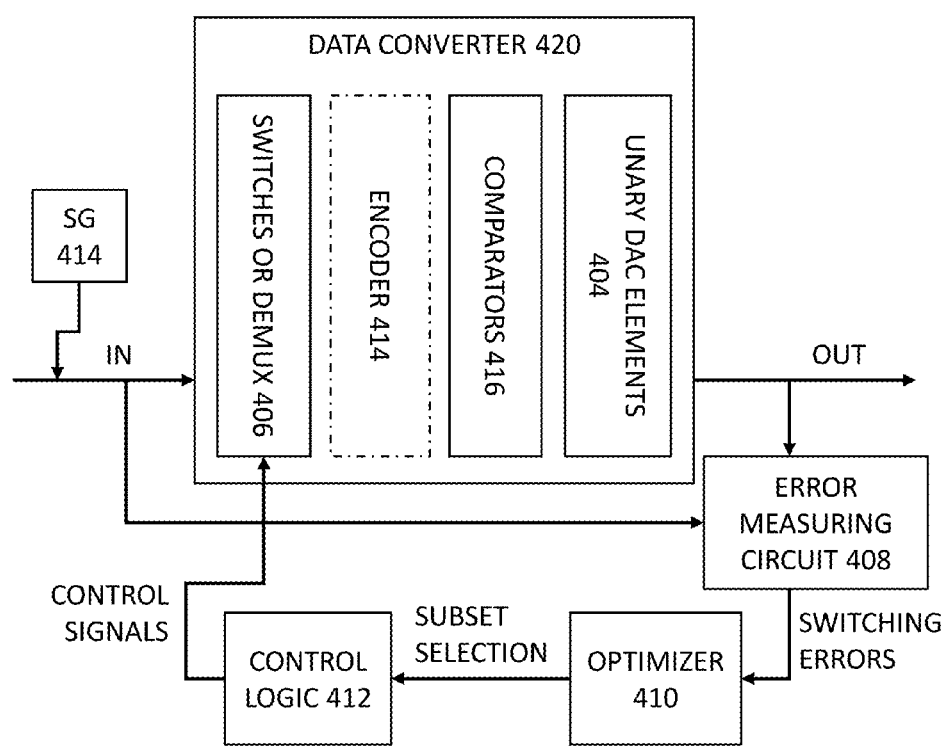
Figure 8:
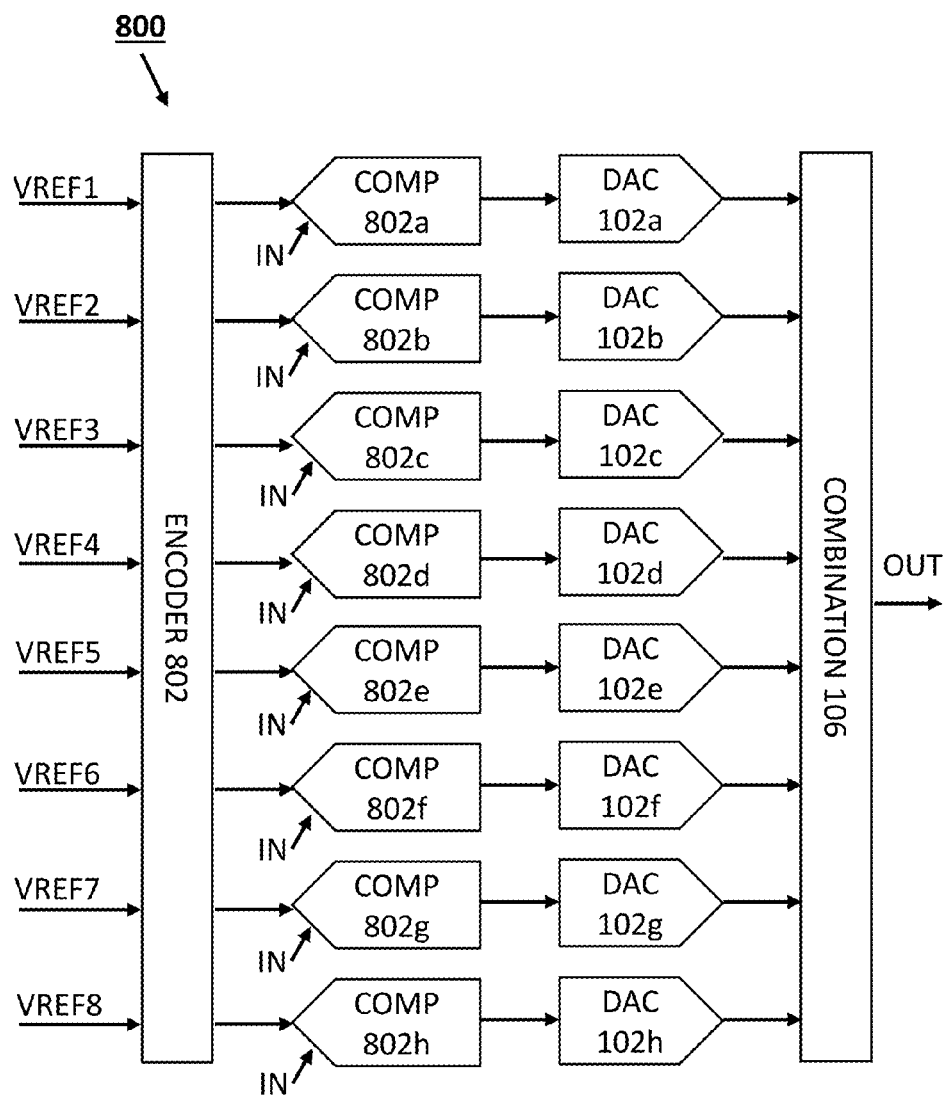
FIG. 8 is an exemplary digital-to-analog converter driven by outputs of comparators to reconstruct an analog input signal, according to some embodiments of the disclosure.

FIG. 4B shows another exemplary data converter having calibration circuitry for reducing switching error, according to some embodiments of the disclosure. In this example, the data converter 420 is an (high-speed) analog-to-digital converter, where outputs of a set of comparators 416 drive the unary DAC elements 404 to reconstruct an analog input signal (e.g., the data converter 420 may be a delta-sigma modulator, a pipeline analog-to-digital converter, etc.). An example is illustrated in FIG. 8. Typically in high-speed applications, mismatch shaping is done by rotating the comparator thresholds to the comparators because adding mismatch shaping at the inputs of the DAC elements is undesirable. The comparators 406 can include redundant comparators corresponding to the redundant unary DAC elements; and instead of selecting the unary DAC elements themselves, it is possible to selectively connect comparator thresholds to the comparators to effectively select the subset of comparators and subset of unary DAC elements for data conversion. In some cases, the comparators and the unary DAC elements have a direct 1:1 relationship or correspondence, and selecting a subset of comparators driving corresponding unary DAC elements effectively selects a subset of comparators and a subset of unary DAC elements for conversion. Also, selecting a subset of unary DAC elements also selects a subset of comparators, i.e., the comparators that drive the subset of DAC elements. For instance, if there are $M=2^Y+R$ number of unary DAC elements, the data converter 420 can include $M=2^Y+R$ number of comparators as well, and the selection of the subset can be done through N number of comparator thresholds to the comparators. Accordingly, the data converter 420 can be optimized by selecting a subset having N comparators and a subset having N unary DAC elements which yields the lesser sum of e2 or ave(e2) by selectively routing N comparator thresholds (reference voltages) to a selected subset having N comparators. In some embodiments, the control logic 412 can output control signals to a plurality of switches 406, and control states of the switches to route reference voltages (as comparator thresholds) to only a subset of comparators of the converter, wherein outputs of the subset of comparators drive the subset of unary DAC elements.

The calibration circuitry of FIG. 4B can perform a method similar to the one described in relation to FIG. 3. Data converter 420 differs from data converter 402 of FIG. 4A in that the data converter 420 further comprises comparators 416 and the outputs of the comparators 416 drive respective unary DAC elements 404. This is often the case when the unary DAC elements 404 are used to reconstruct an analog signal fed to the comparators 416 as part of analog-to-digital conversion, and/or reconstruction of a residue signal in an analog-to-digital converter. Referring back to the method described in relation to FIG. 3, determining a subset of unary DAC elements by the optimizer 410 comprises determining the subset of unary DAC elements having the lesser sum of switching error, wherein the subset of unary DAC elements are driven by a subset of comparators (i.e., comparators corresponding to the subset of unary DAC elements). Calibrating the converter using the control logic includes outputting, by the control logic, control signals to a plurality of switches, and controlling states of the switches to route reference voltages to only the subset of comparators of the converter whose outputs drive the subset of unary DAC elements for data conversion. Determining the subset of unary DAC elements comprises determining sums of switching error corresponding to a plurality of possible subsets of unary DAC elements driven by corresponding comparators. Determining the subset of unary DAC elements further comprises selecting the subset of comparators driving the subset of unary DAC elements having the least sum of switching error.

As previously explained with respect to FIG. 3, the error measuring circuit 408 determines switching errors corresponding to unary digital-to-analog converter (DAC) elements 404. A signal generator 414 (in some cases an external signal generator 414, or on an on-chip signal generator 414) can be provided for either or both data converters 402 and 420 as illustrated in FIGS. 4A-B. The signal generator 414 can be used for generating a pilot signal for the error model, or for generating signals to toggle one unary DAC element at a time while keeping other DAC elements fixed.

Either or both data converters 402 and 420 as illustrated in FIGS. 4A-B can include, a (mismatch shaping) encoder 414 for equalizing usage of the subset of unary DAC elements during data conversion. Together with the calibration circuitry, it is possible to reduce switching induced error attributed to the switching activity induced by the encoder 414.

Switching Schemes at Inputs of Unary DAC Elements

In the following passages, various switching schemes involving control logic 412 and switches 406 are described in detail. Generally speaking, the switches 406 allow a subset having N unary DAC elements to be selected from M unary DAC elements. In some embodiments, the control logic 412 can output control signals to a plurality of switches to route input signals to only a subset of unary DAC elements for conversion. For illustration, FIGS. 5-6 show switching schemes that allow a subset having N=8 unary DAC elements to be selected from M=10 unary DAC elements (comprising DAC elements 102a-h and DAC elements 502a-b). Two are redundant DAC elements. FIG. 7 shows a switching scheme that allows a subset having N=8 unary DAC elements to be selected from M=2*N=16 unary DAC elements (comprising DAC elements 702a-h and 704a-h). N=8 number of unary DAC elements are redundant.

FIG. 5 shows an exemplary switching scheme for selecting a subset of unary DAC elements, according to some embodiments of the disclosure. In this example, the switches 406 of FIG. 4 comprises an arbitrary N to M mapping 504 can map the N input to any subset having N=8 unary DAC elements selected from M=10 unary DAC elements. Effectively, the switches 406 can map N input bits (e.g., thermometer coded input) to any set of N out of M unary DAC elements. The control logic 412 can output control signals to an N to M mapping 504 matrix of switches, wherein N is a number of elements in the subset of unary DAC elements and M is a number of available unary DAC elements. This switching scheme allows for a full range of possible subsets to be selected for data conversion, e.g., allowing M choose N number of possible subsets to be selected for optimizing the DAC. This switching scheme can further allow the ordering of the subset of unary DAC elements to be selected. In some embodiments, the same elements and their associated static mismatches, it is preferred that the elements are ordered in such a way that the mismatch is more random and noise like (rather than having the first half of the elements to be all smaller and second half of the elements to be all bigger). The distortion caused by mismatch without mismatch shaping would then be spread out in frequency rather than concentrate in a few tones.

If control of the ordering is not necessary, it is possible to reduce the complexity of the switches 406 with some other possible switching schemes. FIG. 6 shows another exemplary switching scheme for selecting a subset of unary DAC elements, according to some embodiments of the disclosure. The control logic 412 can output control signals to a plurality of 1 to M−N+1 demultiplexers 602, wherein N is a number of elements in the subset of unary DAC elements and M is a number of available unary DAC elements. In this example, the full N to M mapping is replaced by N number of 1 to M−N+1 demultiplexers 602 (demux) on each input bit, which would still allow complete freedom in the selection of N elements from M elements, though the ordering of N elements cannot be controlled. With N=8 input bits and M=10 elements in this example, 8 1 to 3 demultiplexers are provided to demux each input bit to one of three unary DAC elements.

If the full range of possible subsets is not necessary (nor is the ordering necessary), it is possible to further reduce the complexity of the switches 406 with some other possible switching schemes. In some cases, the full range of possible subsets is not needed to achieve target performance. FIG. 7 shows yet another exemplary switching scheme for selecting a subset of unary DAC elements, according to some embodiments of the disclosure. The control logic can output control signals to N number of 1 to 2 demultiplexers 702, and a total of M=2*N number of unary DAC elements are provided for the data converter (N unary DAC elements are thus redundant). In this example, the switches 406 includes 1 to 2 demuxes for each input bit (thus N number of 1 to 2 demuxes in total), which are provided to demux each input bit to one of two possible unary DAC elements. Such 1-to-2 demux can be implemented by shutting off one of the two unary DAC elements. While this scheme does not provide a full range of possible subsets having N unary DAC elements to be selected from the M available unary DAC elements, the number of possible subsets remains fairly high at $2^N$. For N=8, the number of possible subsets is $2^8$, which would still enable a small enough sum of e2 or ave(e2) to be selected.

If further reduction in circuit complexity is desired, less number of demuxes and in some cases, less number of total available unary DAC elements can be included, thus reducing the number of possible subsets having N unary DAC elements which can be selected from M unary DAC elements. Any of the switching schemes or other suitable switching schemes described herein can be combined into a hybrid switching scheme to offer varying degrees of freedom in choosing N unary DAC elements from M unary DAC elements for data conversion.

Switching Schemes at Comparator Thresholds to Comparators

Figure 9:
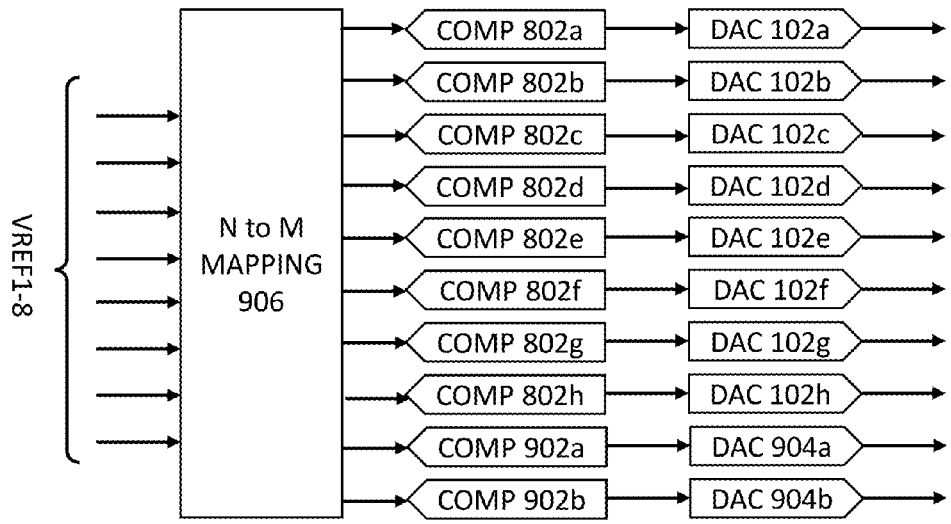
FIG. 9 shows an exemplary switching scheme for selecting a subset of comparators and unary DAC elements, according to some embodiments of the disclosure.
Figure 10:
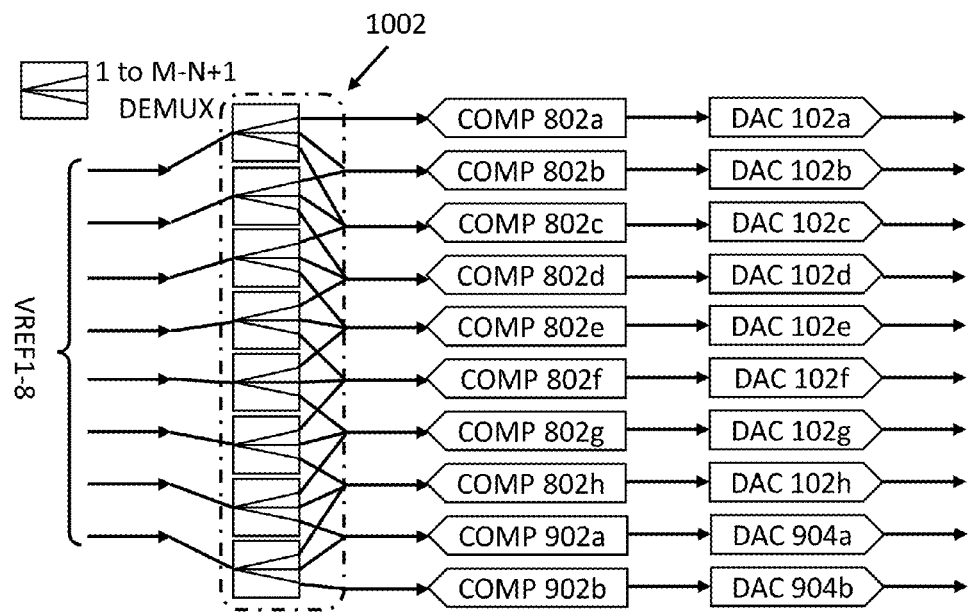
FIG. 10 shows another exemplary switching scheme for selecting a subset of comparators and unary DAC elements, according to some embodiments of the disclosure.
Figure 11:
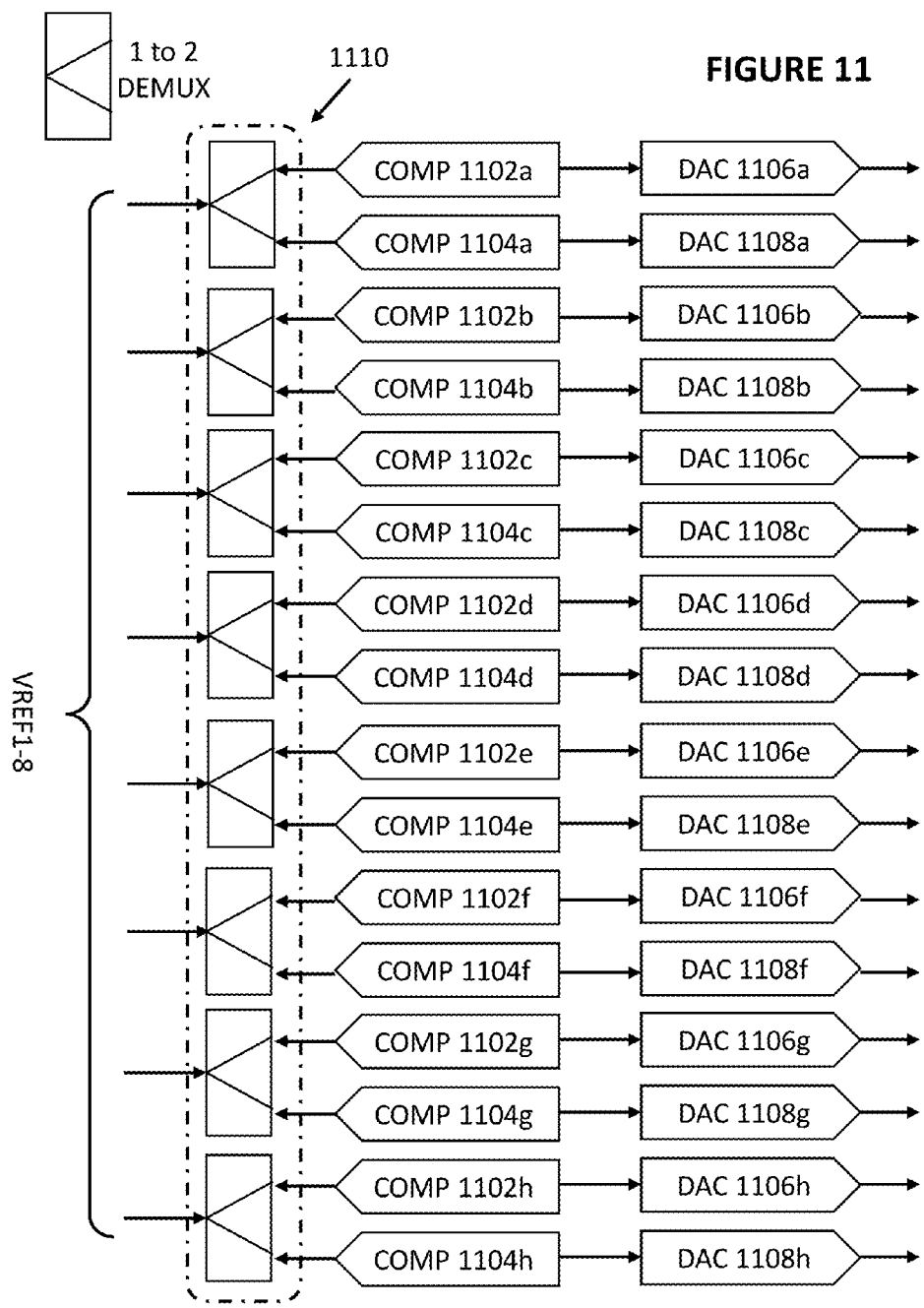
FIG. 11 shows yet another exemplary switching scheme for selecting a subset of comparators and unary DAC elements, according to some embodiments of the disclosure.

Typically in high-speed applications, dynamic element matching (e.g., randomization and mismatch shaping) is done by rotating the comparator thresholds to the comparators (not the inputs to the unary DAC elements) because adding dynamic element matching at the inputs of the DAC elements is undesirable (can slow down the converter). FIG. 8 is an exemplary digital-to-analog converter driven by outputs of comparators to reconstruct an analog input signal, according to some embodiments of the disclosure. The data converter 800 can be part of an (high-speed) analog-to-digital converter, where outputs comparators 802a-h drive the unary DAC elements 102a-h to reconstruct an analog input signal IN at the analog output OUT. For instance, the data converter 800 may be part of a delta-sigma modulator, a pipeline analog-to-digital converter, etc., where such reconstruction is desired. Encoder 802 can randomize or rotate comparator thresholds (e.g., VREF1-8) to comparators 802a-h. For DACs used in high-speed ADCs where mismatch shaping is done through comparator thresholds (e.g., VREF1-8), the number of comparators can also be extended to M, and the selection to reduce switching induced error can be done through the comparators' thresholds. As illustrated by FIGS. 9-11, The comparators 802a-h can include redundant comparators corresponding to the redundant unary DAC elements; instead of selecting the unary DAC elements themselves, it is possible to selectively connect N comparator thresholds (e.g., VREF1-8) to N out of M comparators to effectively select the subset of comparators and subset of unary DAC elements for data conversion.

For instance, if there are $M=2^Y+R$ number of unary DAC elements, the data converter can include $M=2^Y+R$ number of comparators as well, and the selection of the subset can be done through comparator thresholds to the comparators. Accordingly, the data converter can be optimized by selecting a subset of comparators and a subset of unary DAC elements which yields the lesser sum of e2 or ave(e2) by selectively routing comparator thresholds (reference voltages) to a selected subset of comparators. In some embodiments, the control logic 412 can output control signals to a plurality of switches 406, and control states of the switches to route reference voltages (as comparator thresholds, e.g., VREF1-8) to only a subset of comparators of the converter, wherein outputs of the subset of comparators drive the subset of unary DAC elements.

In the following passages, various switching schemes, e.g., involving control logic 412 and switches 406 of FIG. 4 are described in detail. Generally speaking, the switches 406 allow a subset having N comparators and N unary DAC elements to be selected from M comparators and M unary DAC elements. For illustration, FIGS. 9-10 show switching schemes that allow a subset having N=8 comparators and N=8 unary DAC elements to be selected from M=10 comparators (comprising comparators 802a-h and comparators 902a-b) and M=10 unary DAC elements (comprising DAC elements 102a-h and DAC elements 904a-b). Two comparators and two DAC elements are redundant. FIG. 11 shows a switching scheme that allows a subset having N=8 comparators and N=8 unary DAC elements to be selected from M=2*N=16 comparators (comprising comparators 1102a-h and 1104a-h) and M=2*N=16 unary DAC elements (comprising unary DAC Elements 1106a-h and 1108a-h). Eight comparators and eight DAC elements are redundant.

FIG. 9 shows an exemplary switching scheme for selecting a subset of comparators and unary DAC elements, according to some embodiments of the disclosure. In this example, the switches 406 of FIG. 4 comprises an arbitrary N to M mapping 906 can map the N comparator thresholds (e.g., VREF1-8) to any subset having N=8 comparators selected from M=10 comparators. Effectively, the switches 406 can map N comparator thresholds (e.g., VREF1-8) to any set of N out of M comparators. The control logic 412 can output control signals to an N to M mapping 504 matrix of switches, wherein N is a number of elements in the subset of unary DAC elements (and also the number of elements in the subset of comparators) and M is a number of available comparators (and also the number of available comparators). This switching scheme allows for a full range of possible subsets to be selected for data conversion, e.g., allowing M choose N number of possible subsets to be selected for optimizing the DAC. This switching scheme can further allow the ordering of the subset of comparators and corresponding unary DAC elements to be selected. In some cases, ordering can be beneficial in making static mismatches more random and noise like (as previously mentioned), especially if mismatch shaping is not implemented or used.

If control of the ordering is not necessary, it is possible to reduce the complexity of the switches 406 with some other possible switching schemes. FIG. 10 shows another exemplary switching scheme for selecting a subset of comparators and unary DAC elements, according to some embodiments of the disclosure. The control logic 412 can output control signals to a plurality of 1 to M−N+1 demultiplexers 1002, wherein N is a number of elements in the subset of unary DAC elements (and also the number of elements in the subset of comparators) and M is a number of available unary DAC elements (and also the number of available comparators). In this example, the full N to M mapping is replaced by N number of 1 to M−N+1 demultiplexers 1002 (demux) on each input bit, which would still allow complete freedom in the selection of N elements from M elements, though the ordering of N elements cannot be controlled. With N=8 input bits in this example, 8 1 to 3 demultiplexers are provided to demux each comparator threshold to one of three comparators.

If the full range of possible subsets is not necessary (nor is the ordering necessary), it is possible to further reduce the complexity of the switches 406 with some other possible switching schemes. In some cases, the full range of possible subsets is not needed to achieve target performance. FIG. 11 shows yet another exemplary switching scheme for selecting a subset of comparators and unary DAC elements, according to some embodiments of the disclosure. The control logic can output control signals to N number of 1 to 2 demultiplexers 1110, and a total of M=2*N number of unary DAC elements are provided for the data converter (N unary DAC elements are thus redundant). In this example, the switches 406 includes a 1 to 2 demuxes for each comparator threshold (thus N number of 1 to 2 demuxes in total), which are provided to demux each comparator threshold to one of two possible comparators. Such 1-to-2 demux can be implemented by shutting off or powering down one of two comparator and unary DAC element pairs. While this scheme does not provide a full range of possible subsets having N comparators and N unary DAC elements to be selected from the M available comparators and M available unary DAC elements, the number of possible subsets remains fairly high at $2^N$. For N=16, the number of possible subsets is $2^{16}$, which would still enable a small enough sum of e2 or ave(e2) to be selected.

If further reduction in circuit simplicity is desired, less number of demuxes and in some cases, less number of total available comparators and unary DAC elements can be included, thus reducing the number of possible subsets having N comparators and N unary DAC elements which can be selected from M comparators and M unary DAC elements. Any of the switching schemes or other suitable switching schemes described herein can be combined into a hybrid switching scheme to offer varying degrees of freedom in choosing N comparators and N unary DAC elements from M comparators and M unary DAC elements for data conversion.

VARIATIONS AND IMPLEMENTATIONS

In certain contexts, the features discussed herein can be applicable to medical systems, scientific instrumentation, wireless and wired communications, radar, industrial process control, audio and video equipment, current sensing, instrumentation, military and aerospace systems, and any system where digital-to-analog conversion with reduced switching error is desired.

Many of the illustrations are described using examples of DACs having unary DAC elements. It is envisioned by the disclosure that the calibration techniques can also be applied to other DAC architectures, including ones with a segmented design where only a part of the DAC is made up of unary DAC elements.

While the present disclosure mentions applying the calibration scheme to reduce switching error induced by element rotation mismatch shaping, the same calibration scheme can be applied to reducing switching error induced by randomization and other dynamic element matching techniques as well.

Parts of the FIGURES for reducing switching induced error can include electronic circuitry to perform the functions described herein. In some cases, one or more parts of the apparatus can be provided by a processor specially configured for carrying out the functions described herein (e.g., such as the error measuring circuit and optimizer). For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any number of electrical circuits of the FIGURES (e.g., parts of FIG. 4) may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to reducing switching error, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for reducing effect of switching errors, the method comprising:
   determining, by an error measuring circuit, switching errors corresponding to digital-to-analog converter (DAC) elements in a converter;
   determining, by an optimizer, a subset of DAC elements having a lesser sum of switching errors than one or more other possible subsets of DAC elements; and
   calibrating, using control logic, the converter by selecting the subset of DAC elements for data conversion.

2. The method of claim 1, wherein the switching errors are independent from switching direction.

3. The method of claim 1, wherein the switching errors cause a second order distortion if a sum of the switching errors is not zero.

4. The method of claim 1, further comprising:
   permanently turning off one or more DAC elements which are not in the subset of DAC elements.

5. The method of claim 1, wherein the calibrating of the converter comprises:
   outputting, by the control logic, control signals to a plurality of switches; and
   controlling states of the switches to route input signals to only the subset of DAC elements for data conversion.

6. The method of claim 1, wherein the determining of the subset of DAC elements having the lesser sum of switching error comprises:
   determining sums of switching error corresponding to a plurality of possible subsets of DAC elements.

7. The method of claim 6, wherein the determining of the subset of DAC elements having the lesser sum of switching error further comprises:
   selecting the subset of DAC elements having the least sum of switching error.

8. The method of claim 1, wherein:
   the converter further comprises comparators and the outputs of the comparators drive respective DAC elements; and
   the determining of the subset of DAC elements comprises determining the subset of DAC elements having the lesser sum of switching error, wherein the subset of DAC elements are driven by a subset of comparators.

9. The method of claim 8, wherein the calibrating the converter comprises:
   outputting, by the control logic, control signals to a plurality of switches; and
   controlling states of the switches to route reference voltages to only the subset of comparators of the converter whose outputs drive the subset of DAC elements for data conversion.

10. The method of claim 8, wherein the determining of the subset of DAC elements comprises:
    determining sums of switching error corresponding to a plurality of possible subsets of DAC elements driven by corresponding comparators.

11. Circuitry for reducing switching errors, the circuitry comprising:
    an error measuring circuit for measuring average output of the digital-to-analog (DAC) elements in a converter while toggling one DAC element at a time to determine switching errors corresponding to DAC elements;
    an optimizer for determining a subset of DAC elements having a lesser sum of switching errors than one or more other possible subsets of DAC elements; and
    control logic for calibrating the converter by selecting the subset of DAC elements for data conversion.

12. The circuitry of claim 11, further comprising:
    a signal generator generating one or more inputs to the converter for toggling an output of one DAC element at a time at different toggling frequencies while keeping outputs of the rest of the DAC elements fixed.

13. The circuitry of claim 11, wherein the control logic outputs control signals to an N to M mapping matrix of switches, wherein N is a number of elements in the subset of DAC elements and M is a number of available DAC elements.

14. The circuitry of claim 11, wherein the control logic outputs control signals to a plurality of 1 to M−N+1 demultiplexers, wherein N is a number of elements in the subset of DAC elements and M is a number of available DAC elements.

15. The circuitry of claim 11, wherein the control logic outputs control signals to a plurality of 1 to 2 demultiplexers.

16. The circuitry of claim 11, wherein:
    the control logic is configured to output control signals to a plurality of switches to route input signals to only a subset of DAC elements for conversion.

17. The circuitry of claim 11, wherein:
    the control logic is configured to output control signals to a plurality of switches to route reference voltages to only a subset of comparators of the converter, wherein outputs of the subset of comparators drive the subset of DAC elements.

18. A data converter with reduction of switching error worsened by dynamic element matching, the data converter comprising:

digital-to-analog converter (DAC) elements comprising one or more redundant DAC elements;

an error measuring circuit for determining switching errors corresponding to the DAC elements;

an optimizer for determining a subset of DAC elements having a lesser sum of switching errors than one or more other possible subsets of DAC elements; and control logic for calibrating the data converter by selecting the subset of DAC elements for data conversion.

19. The data converter of claim 18, further comprises:
a mismatch shaping encoder for equalizing usage of the subset of DAC elements during data conversion.

20. The data converter of claim 18, further comprising:
comparators for comparing an analog input to different reference voltages and outputs of the comparators drive the DAC elements to reconstruct the analog input;

wherein the control logic is configured to output control signals to a plurality of switches to route reference voltages to only a subset of comparators of the converter, wherein outputs of the subset of comparators drive the subset of DAC elements.

21. The method of claim 1, wherein the DAC elements are unary weighted, and usage of the subset of DAC elements for data conversion are substantially equalized by a switching scheme.

22. The method of claim 1, wherein the switching errors are non-linearly dependent on the input to the DAC elements.

23. The method of claim 1, further comprising:
generating one or more inputs to the converter for toggling an output of one DAC element at a time at different toggling frequencies while keeping outputs of the rest of the DAC elements fixed.

24. The method of claim 23, further comprising:
measuring average outputs of the DAC elements for different toggling frequencies.

25. The method of claim 24, wherein the determining of the switching errors comprises:
characterizing a switching error based on at least two different average outputs corresponding to different toggling frequencies.

26. The method of claim 1, wherein the determining of the switching errors comprises using a pilot tone as an input to the converter and solving for switching errors corresponding to the DAC elements based on an observed output.

27. The method of claim 26, wherein the pilot tone is a sinewave.

28. The circuitry of claim 11, wherein the DAC elements are unary weighted, and usage of the subset of DAC elements for data conversion are substantially equalized by a switching scheme.

29. The circuitry of claim 11, wherein the switching errors are non-linearly dependent on the input to the DAC elements.

30. The data converter of claim 18, wherein the DAC elements are unary weighted.

31. The data converter of claim 18, wherein the switching errors are non-linearly dependent on the input to the DAC elements.

* * * * *